United States Patent
Tsividis (10) Patent No.: US 7,049,875 B2
(45) Date of Patent: May 23, 2006

(54) ONE-PIN AUTOMATIC TUNING OF MOSFET RESISTORS

(75) Inventor: Yannis Tsividis, New York, NY (US)

(73) Assignee: Theta Microelectronics, Inc., San Jose, CA (US)

( * ) Notice: Subject to any disclaimer, the term of this patent is extended or adjusted under 35 U.S.C. 154(b) by 0 days.

(21) Appl. No.: 10/865,605

(22) Filed: Jun. 10, 2004

(65) Prior Publication Data

US 2005/0275447 A1  Dec. 15, 2005

(51) Int. Cl.
*H03L 5/00* (2006.01)
(52) U.S. Cl. .................. 327/308; 327/334; 330/258
(58) Field of Classification Search ........... 327/334, 327/308, 108; 330/258
See application file for complete search history.

(56) References Cited

U.S. PATENT DOCUMENTS

| | | | |
|---|---|---|---|
| 4,509,019 A | | 4/1985 | Banu et al. |
| 4,665,423 A | | 5/1987 | Akiya |
| 5,194,865 A | * | 3/1993 | Mason et al. ............ 341/132 |
| 5,298,800 A | * | 3/1994 | Dunlop et al. ........... 327/108 |
| 5,345,118 A | | 9/1994 | White et al. |
| 5,460,040 A | * | 10/1995 | Tada et al. ............... 73/204.25 |
| 5,994,951 A | | 11/1999 | Mazhar et al. |
| 6,265,946 B1 | * | 7/2001 | Bartlett .................... 331/17 |
| 6,281,740 B1 | * | 8/2001 | Hedberg .................. 327/530 |
| 6,466,081 B1 | * | 10/2002 | Eker ....................... 327/541 |
| 6,504,417 B1 | * | 1/2003 | Cecchi et al. ............ 327/308 |
| 6,529,066 B1 | * | 3/2003 | Guenot et al. ........... 327/539 |
| 6,563,371 B1 | * | 5/2003 | Buckley et al. .......... 327/539 |
| 6,686,797 B1 | * | 2/2004 | Eker ....................... 327/539 |
| 6,703,682 B1 | | 3/2004 | Aswell |
| 6,819,170 B1 | * | 11/2004 | Kindt ...................... 327/563 |
| 6,822,502 B1 | * | 11/2004 | Soda ....................... 327/308 |
| 6,836,170 B1 | * | 12/2004 | Kitagawa et al. ........ 327/308 |
| 2003/0102916 A1 | | 6/2003 | Yu et al. |

OTHER PUBLICATIONS

Tsividis, Yannis et al., "Continuous-Time MOSFET-C Filters in VLSI", IEEE Journal of Solid-State Circuits, Feb. 1986, pp. 15-30, vol. SC-21, No. 1.

Laber, C.A. et al., "A 20MHz 6th Order BiCMOS Programmable Filter Using Parastic-Insensitive Integrators", 1992 Symposium on VLSI Circuits Digest of Technical Papers, 1992, pp. 104-105.

Laber, Carlos A. et al., "A 20-MHz Sixth-Order BiCMOS Parasitic-Insensitive Continuous-Time Filter and Second-Order Equalizer Optimized for Disk-Drive Reac Channels", IEEE Journal of Solid-State Circuits, Apr. 1993, pp. 462-470, vol. 28, No. 4.

* cited by examiner

*Primary Examiner*—Kenneth B. Wells
*Assistant Examiner*—Khareem E. Almo
(74) *Attorney, Agent, or Firm*—Blakely, Sokoloff, Taylor & Zafman LLP (57) ABSTRACT

Methods and apparatus for automatic tuning of MOSFET resistors providing accuracy and linearity throughout process and temperature variations. In accordance with the methods, the source and drain of a MOSFET device are biased in a balanced manner around a common mode voltage using a circuit controlling the gate voltage of the MOSFET to set the current through the MOSFET responsive to the value of a resistor. Operating MOSFETs, such as in MOSFET-C filters, with the same device conductivity type, gate bias, substrate voltage and signal common mode voltage provides linear MOSFET resistors, accurately set by a single resistance value. Use of an external resistor provides a single pin setting of MOSFET resistances, that may be independent of temperature and process variations. Various embodiments are disclosed.

59 Claims, 5 Drawing Sheets

ONE-PIN AUTOMATIC TUNING OF MOSFET RESISTORS

BACKGROUND OF THE INVENTION

1. Field of the Invention

The present invention relates generally to techniques for controlling the resistance of on-chip MOSFET resistors, and specifically to those techniques using a resistor, such as an external accurate resistor, to control the on-chip resistance of MOSFET resistors.

2. Prior Art

In many applications, for example MOSFET-C filters, there is a known need for precision resistors in order to obtain the necessary parameters for a specific circuit. However, achieving such accuracy for on-chip resistors is complex due to relatively high variability of the manufacturing process, as well as environmental impacts, such as temperature. Prior art technologies for precision resistors include technologies such as trimming, including LASER based trimming, use of specialty manufacturing processes, or simulation of a resistor using a metal oxide semiconductor (MOS) device. While the use of a single MOS device may provide highly non-linear results, one solution suggested in the prior art is the use of an impedance element made up of two N-type MOS (NMOS) devices in such a way that such nonlinearities cancel out.

Figure 1:
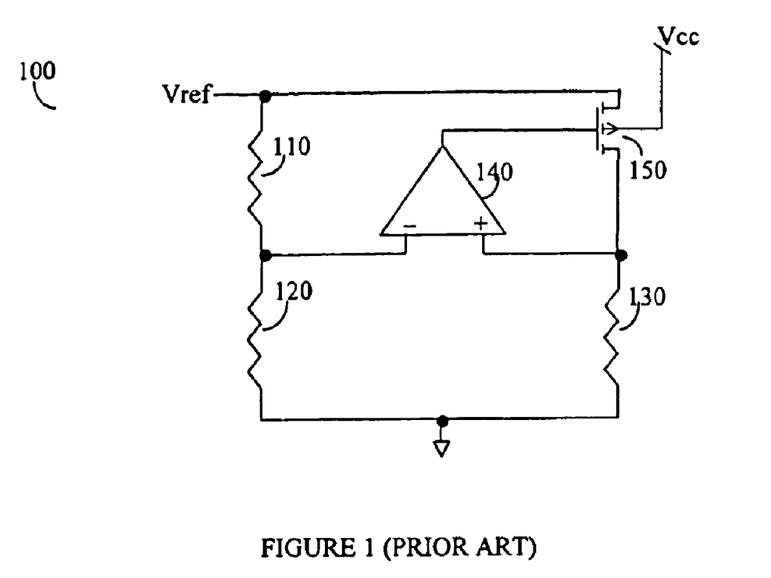
FIG. 1 is a schematic diagram of an exemplary bridge FET resistor.

Another possibility is to use the circuit shown in FIG. 1. The circuit is a bridge that uses a grounded external resistor ($R_{EXT}$) 130. The circuit tunes the resistance of field effect transistor (FET) 150, which operates in the triode region. The gate voltage supplied to FET 150 is also applied to the gates of a filter's MOSFETs, for example a MOSFET-C filter (not shown). $V_{REF}$ is the reference voltage used in the filter, which is the quiescent value of the source and drain voltages of the MOSFETs in the filter, e.g. 2V. A feedback loop is applied by operational amplifier 140 and FET 150 so that the voltage on both positive and negative inputs of operational amplifier 140 are identical, noting that these inputs also represent a high input impedance. As a result:

$$\frac{R_{SD}}{R_{EXT}} = \frac{R_1}{R_2}$$

where R1 is resistor 110 and R2 is resistor 120, and where RSD is:

$$R_{SD} = \frac{V_{SD}}{I_S}$$

A person skilled in the art would note that $V_{SD}$ and $I_S$ are used because they are positive quantities for the PMOS FET 150. One would further note that:

$$V_{SD} = V_{REF} \frac{R_1}{R_1 + R_2}$$

By choosing $R_1/R_2$ ratio to be much smaller than 1, the voltage across FET 150 can be made much smaller than $V_{REF}$. This enables the operation of FET 150 in the deep triode zone. Assuming now that $R_1/R_2=1/19$, the voltage $V_{SD}$ shall be 0.1V. Using a FET 150 having, for example, a width of 7 microns and a length of 1 micron, then in order to achieve a resistance of 6 KOhm for $R_{SD}$ of FET 150, the value of $R_{EXT}$ 130 should be at 114 KOhm. Simulations using a gain of 1000 for operational amplifier 140 will confirm the values, and $R_{SD}$ is found to be 5.99 KOhm. However, when the resulting bias values of FET 150 are used to calculate its small-signal drain-source resistance at $V_{SD}=0$, a value of about 5.4 KOhm is found. This problem is the result of the relationship between $I_S$ and $V_{SD}$ as is evident from the curvature of $I_S$ vs. $V_{SD}$ in the triode region, as the large-signal resistance of FET 150 is not constant. Therefore at $V_{SD}=0.1V$, the resistance is 6 KOhm, while at $V_{SD}$ close to 0, the resistance of FET 140 decreases by about 10%. This makes the accuracy of the tuning very poor, since it is the small-signal resistance at $V_{SD}=0$ that is the relevant parameter in linearized MOSFET-C filter integrators.

It is noteworthy that it may be tempting to compensate for the above problem by increasing the value of $V_{SD}/I_S$ to which system 100 settles, so that the small-signal resistance at $V_{SD}=0$ becomes 6 KOhm as desired. However, this solution does not work since such adjustment must be based on accurate modeling in the triode region, which may not be readily available. Further, even if modeling was accurate, the adjustment would only work at one set of parameters and one temperature, providing a very limited range of reasonable operation. As the parameters change, for example due to temperature changes, a variation of 10% between the extremes may be caused, rendering the solution impractical.

Another way to bypass the above problems is by decreasing the value used for $V_{SD}$ so that it is closer to 0. However, reduction of $V_{SD}$ makes circuit 100 very sensitive to operational amplifier 140 equivalent input offset voltage. A person skilled in the art could easily verify this using simulations or test chips.

Due to the limitations of prior art solutions, it would be advantageous to provide a solution for a precision resistor comprised of a FET device with an ability to precisely control its resistance. It would be further advantageous if a single pin can be used to determine such value externally of an integrated circuit.

DETAILED DESCRIPTION OF THE PREFERRED EMBODIMENTS

Figure 2A:
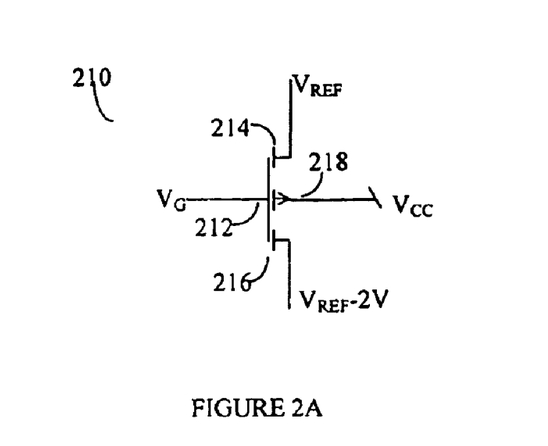
FIG. 2A is a schematic diagram of an unbalanced drive of a FET device.

In order to overcome the deficiencies of the prior art, each MOSFET being tuned must be linearized so that its large-signal resistance $V_{SD}/I_S$ at large $V_{SD}$ is equal to its small-signal resistance at $V_{SD}$32 0. This can be done for each MOSFET by driving it in a balanced fashion. Reference is now made to FIG. 2A where a schematic diagram of an unbalanced drive of FET device 210 is shown. FET 210 is shown as a PMOS device, however, a person skilled in the art would easily extend the discussion herein to an NMOS device. The gate 212 of FET 210 receives a gate voltage $V_G$ and the substrate 218 is connected to $V_{CC}$. Using the example of FIG. 1 for transistor 150, the source of FET 210 is at a potential of $V_{REF}$ and the drain 216 is at a potential level of $V_{REF}-2V$.

Figure 2B:
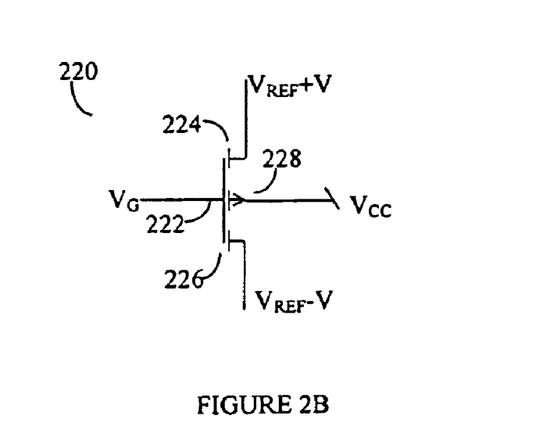
FIG. 2B is a schematic diagram of a balanced drive of a FET device.
Figure 3:
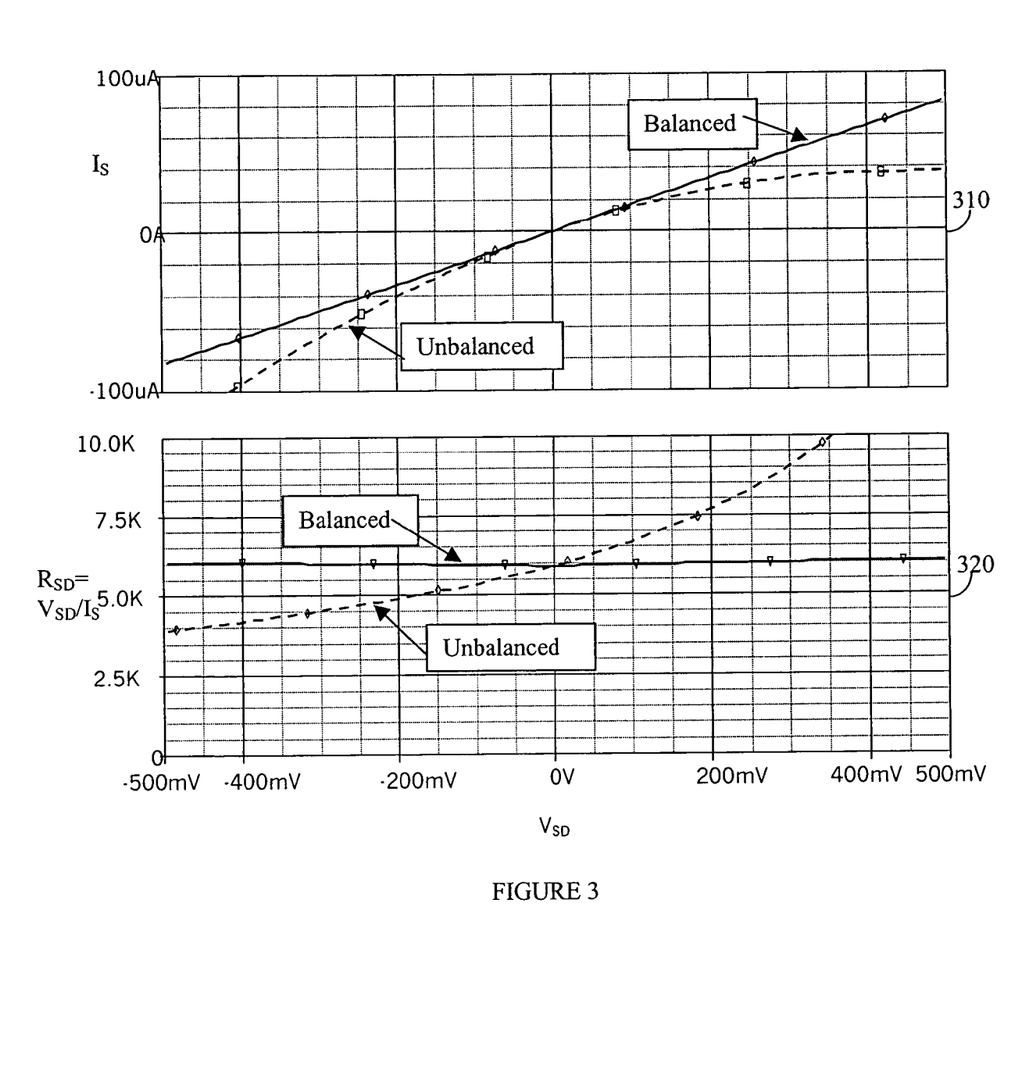
FIG. 3 is a diagram of a current/voltage relationship of balanced and unbalanced driven MOS devices.

Referring now to FIG. 2B, a schematic diagram of a balanced drive of FET device 220 is shown. The gate 222 of FET 220 receives a gate voltage $V_G$ and the substrate 228 is connected to $V_{CC}$. The source of FET 220 is at a potential Of $V_{REF}+V$ and the drain 226 is at a potential level of $V_{REF}-V$. Therefore, both FET devices 210 (FIG. 2A) and 220 (FIG. 2B) have the same $V_{SD}=2V$, where V is a given voltage value. In FIG. 3, for each FET device 210 and 220, current versus source drain voltage $V_{SD}$ is plotted in diagram 310, and the large-signal resistance, $R_{SD}=V_{SD}/I_S$, versus source drain voltage $V_{SD}$, is plotted in diagram 320. The reason the balanced-driven FET device 220 behaves linearly is the cancellation of terms containing the squares of +V and −V in FET 220 current equation. The unbalanced FET 210 has a non-linear behavior of $R_{SD}$. Therefore it would be advantageous to apply this quality to create a FET based precision resistor, particularly where the resistance value is controlled by an external resistor.

Figure 4:
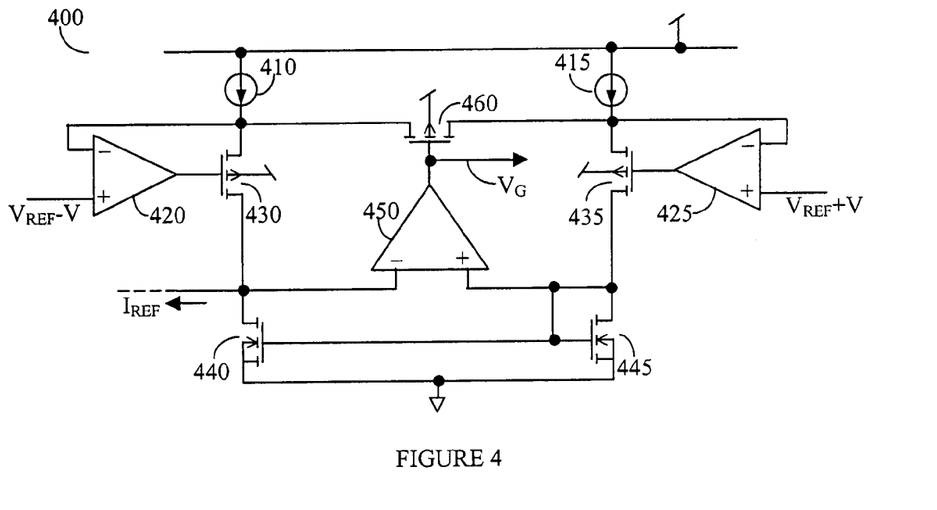
FIG. 4 is a schematic diagram of a tuning system based on a balanced FET device.

Now referring to FIG. 4, an exemplary schematic diagram of a tuning system 400 based on a balanced FET device may be seen. The voltage $V_G$ applied to the gate of FET 460 is assumed to also be applied to the filter's MOSFET resistors, as noted above. Bias current sources 410 and 415 are assumed to be equal current sources, and NMOS current mirror 445, 440 is assumed to be a 1 to 1 current mirror. Through operational amplifiers 420 and 425, FET 430, and FET 435, a voltage at a level of 2V is applied across FET 460. The source and drain of FET 460 are driven in a balanced fashion with respect to $V_{REF}$. With 2 volts across the FET 460 and $R_{SD}$ being the channel resistance, the current in FET 460 is $2V/R_{SD}$. Due to the current mirror and the current through FET 460, the total current supplied to the node connecting the drains of PMOS FET 430 and NMOS FET 440 is thus $4V/R_{SD}$, and this must be equal to the separately supplied current $I_{REF}$, as explained in more detail below. The negative feedback, through a simple amplifying stage 450, ensures that this is in-fact the case. For example, if $R_{SD}$ is too large, $4V/R_{SD}$ will be less than $I_{REF}$, causing. $I_{REF}$ to pull down the voltage at the node connecting the drains of PMOS FET 430 and NMOS FET 440. As a result, $V_G$ decreases and thereby causes the decrease of the resistance of FET 460. Amplifier 450 is needed to provide sufficient loop gain on the difference between the voltages of the node connecting the drains of PMOS FET 430 and NMOS FET 440 and of the node connecting the drains of PMOS FET 435 and NMOS FET 445. This exemplary circuit therefore provides that:

$$R_{SD} = \frac{4V}{I_{REF}}$$

To ensure proper operation of circuit 400, reference current $I_{REF}$ and V preferably are generated in a coordinated fashion.

Figure 5:
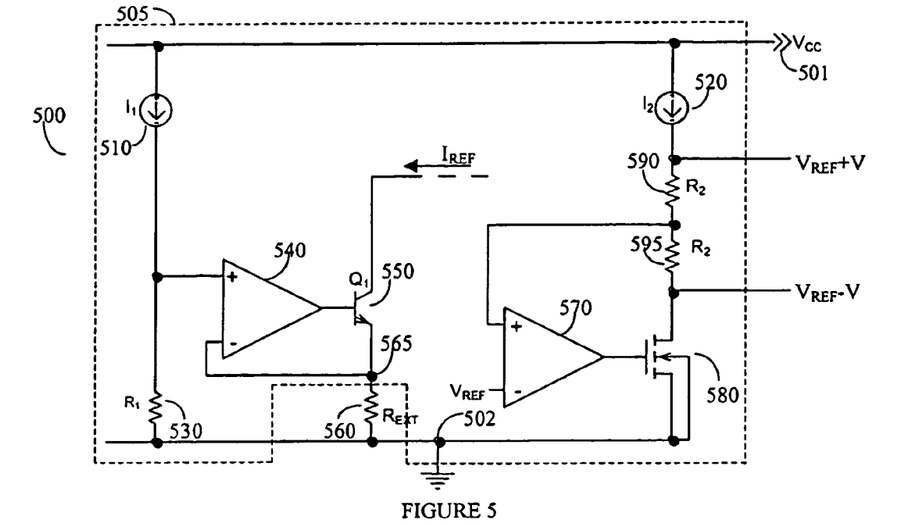
FIG. 5 is a schematic diagram of a first circuit for providing coordinated reference current and balanced voltage.

Reference is now made to FIG. 5 where an exemplary schematic diagram of a circuit 500 connected to power supply terminal $V_{CC}$ 501 and ground terminal 502, for providing coordinated reference current and balanced voltages is shown. In circuit 500, operational amplifier 570 drives the middle node between the two equal resistors 590 and 595 to $V_{REF}$. A current source 520 drives an equal current through both resistors 590 and 595 and therefore the other node of each of the resistors 590 and 595 assumes a potential symmetrically located around $V_{REF}$, i.e., $V_{REF}+(I_2*R_2)$ and $V_{REF}-(I_2*R_2)$ respectively, where the current $I_2$ is the current from current source 520, R is the value of each of the resistors 590 and 595, and the voltage across each resistor 590 and 595 is denoted by V, equal to $I_2*R_2$. The current IREF is generated by driving current through resistor 530 from source current 510. The potential developed on the positive node of operational amplifier 540, and due to its negative feedback configuration, causes the same potential to develop at the negative node of operational amplifier 540, wherein the potential is equal to $R_1I_1$, $R_1$ being resistor 530 and $I_1$ being the current of current source 510. Therefore, assuming a negligible base current of transistor 550:

$$I_{REF} = \frac{R_1 I_1}{R_{EXT}}$$

where $R_{EXT}$ is resistor 560, which preferably would be an external resistor to an integrated circuit 505, or 805 in another embodiment described in more detail below, containing the circuits disclosed herein, and connected between node 565 of the integrated circuit 505 and around terminal 502. As noted above:

$$V = R_2 I_2$$

and therefore:

$$R_{SD} = \frac{4V}{I_{REF}} = 4\frac{R_2}{R_1}\frac{I_2}{I_1}R_{EXT}$$

which shows the value of $R_{SD}$ to be a function of external resistor 560, ensuring a precise resistance to $R_{SD}$ in comparison to prior art solutions. Note also, that $R_{SD}$ is proportional to the ratio of $R_2/R_1$ and the ratio of $I_2/I_1$, not absolute values of either the resistances or current sources, which ratios may be easily maintained substantially constant in spite of process and temperature variations.

Figure 8:
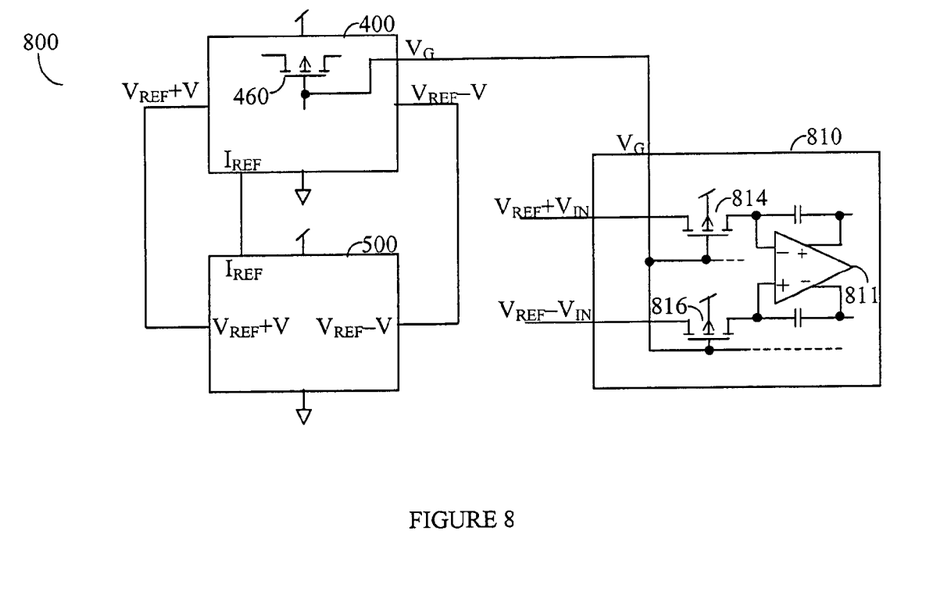
FIG. 8 is a schematic diagram of an exemplary circuit making usage of the disclosed invention.

In FIG. 8, a schematic diagram of an exemplary circuit 800 making use of the present invention may be seen. A coordinated reference current and balanced voltage supply 500 (such as that shown in FIG. 5) is supplied to a tuning system based on a balanced FET 400 (such as that shown in FIG. 4). Circuit 505 further supplies the required $V_{REF}+V$ and $V_{REF}-V$ to circuit 400. A respective voltage $V_G$ is supplied to circuit 810 from circuit 400. Circuit 810 is an exemplary basic differential RC integrator building block, such as the one disclosed by Banu and Tsividis in U.S. Pat. No. 4,509,019, entitled "Tunable Active Filter." The building block is used as part of a continuous time (not switched capacitor) MOSFET-C filter 805, being controlled by external resistor 560. The transistors 814 and 816 of circuit 810 have the same gate voltage $V_G$, the same reference voltage, and the same substrate bias as FET 460 of circuit 400. In a preferred embodiment of the disclosed invention, transistors 460, 814 and 816 will not only have the same gate voltage $V_G$ and substrate voltage, but also will be of the same type, for example P-channel transistors, and further preferably have the same L and W as the FET 460. If the later is not the case, then resistance will scale approximately proportionately to the ratio between L and W. The voltages $+V_{IN}$ and $-V_{IN}$ are signal voltages, which can come from, but is not limited to, a differential input source having a common mode voltage of $V_{REF}$ or from internal points in the filter (such as, by way of example, a prior stage of a multistage RC filter). Operational amplifier 811 of circuit 810 is a fully-balanced operational amplifier. The output is equivalent to that of a single RC integrator as shown by Banu and Tsividis.

It can be shown, as for example in "Tsividis et al., "Continuous-time MOSFET-C filters in VLSI", IEEE Journal of Solid-State Circuits, Vol. SC-21, No. 1, Pgs. 15–30 (February 1986) that the nonlinearities of the two devices in the integrator cancel out, and that the output is equivalent to that of a linear active RC integrator. It is further shown in the above reference that the effective R value of the MOSFET pair is equal to that of a device driven in a balanced fashion. In the present invention, device 460 is driven in a balanced fashion, and operates in the triode (non-saturation) region, and have the same voltages $V_G$ and $V_{REF}$, as well as the same substrate voltage. Thus, when the device 460 in circuit 400 is tuned, the devices in the filter, for example in circuit 810, are tuned as well. Operation of transistor. 460 (FIG. 4) in the triode region may be assured by appropriate selection (limitation) of the voltage V and the current $I_{REF}$, which may in turn be controlled by circuit design, and once designed, by limiting the values of control resistance that may be used. In general, the lower $I_{REF}$, the lower the voltage V must be, as the upper limits of both to adequately stay in the triode region are interrelated.

Figure 6:
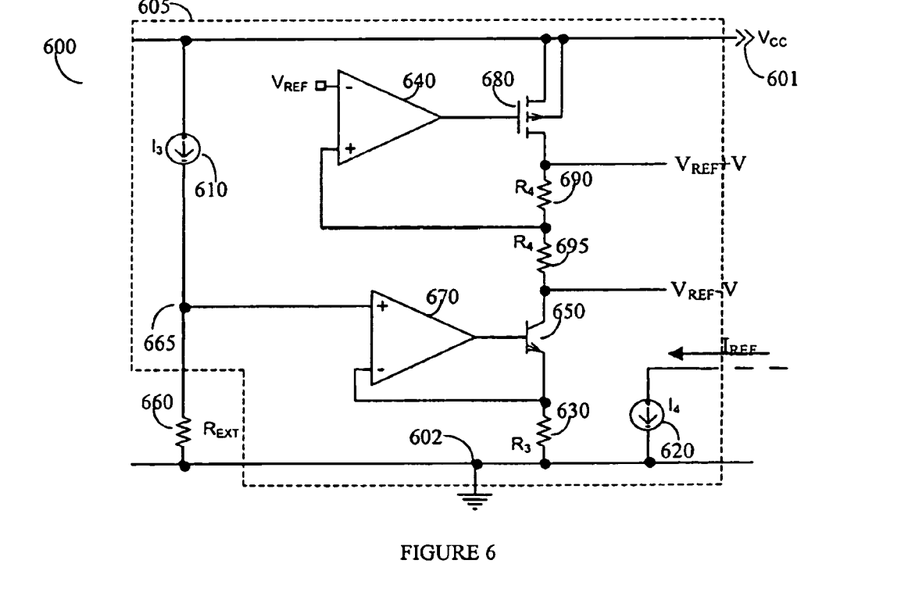
FIG. 6 is a schematic diagram of a second circuit for providing coordinated reference current and balanced voltage.

Reference is now made to FIG. 6 where a schematic diagram of another exemplary circuit 600, connected to power supply terminal $V_{CC}$ 601 and ground terminal 602, for providing coordinated reference current and balanced voltages is shown. In this embodiment of the invention, operational amplifier 640 ensures that the voltage on the node connecting equal resistors 690 and 695 will be $V_{REF}$. The voltage developed on external resistor 660 is proportional to the current from current source 610 and the value of the resistor itself. The circuit forces an equal voltage to be developed on resistor 630 due to the negative feedback of operational amplifier 670. Assuming a negligible base current of transistor 650, the current through resistors 690 and 695 is:

$$\frac{I_3 R_{EXT}}{R_3}$$

and therefore the value of the voltage V developed on each of resistors 690 and 695 is:

$$V = R_4 \frac{R_{EXT} I_3}{R_3}$$

Now, with $I_{REF}=I4$, it is easy to show that:

$$R_{SD} = 4 \frac{R_4}{R_3} \frac{I_3}{I_4} R_{EXT}$$

which shows the value of $R_{SD}$ to be a function of external resistor 660, connected between node 665 of integrated circuit 605 and ground terminal 602, ensuring a precise resistance to $R_{SD}$ in comparison to prior art solutions, and where circuit 605 may be implemented as an integrated circuit. In both cases shown in FIGS. 5 and 6, $R_{SD}$ is equal to $R_{EXT}$ multiplied by a constant. The constant can be accurately set in spite of process variations, and is temperature-insensitive, since it depends only on ratios of resistances and currents. However, in the circuit of FIG. 5, the circuit predetermines the value of the voltage V, with the external resistor $R_{EXT}$ determining the current through the transistor 460 (FIG. 4). In the circuit of FIG. 6, the circuit predetermines the current through the transistor 460 (FIG. 4), with the external resistor $R_{EXT}$ determining the value of the voltage V.

The circuit 500 has been simulated using simple models with all channel lengths equal to 1 micron, the width (W) of FET 660 being 7 microns, and all other widths equal to 80 microns, total current I=200 µA, the amplification of amplifier 550 at 10, $V_{REF}=2$ V, all operational amplifiers having a gain of 1000, and $I_{REF}$ generated by circuit 400, with $R_{EXT}=1.5$ KOhm, $R_1=1$ KOhm, $I_1=100$ µA, $I_2=100$ µA, and $R_2=1$ KOhm, resulting in a V=0.1 V.

Figure 7:
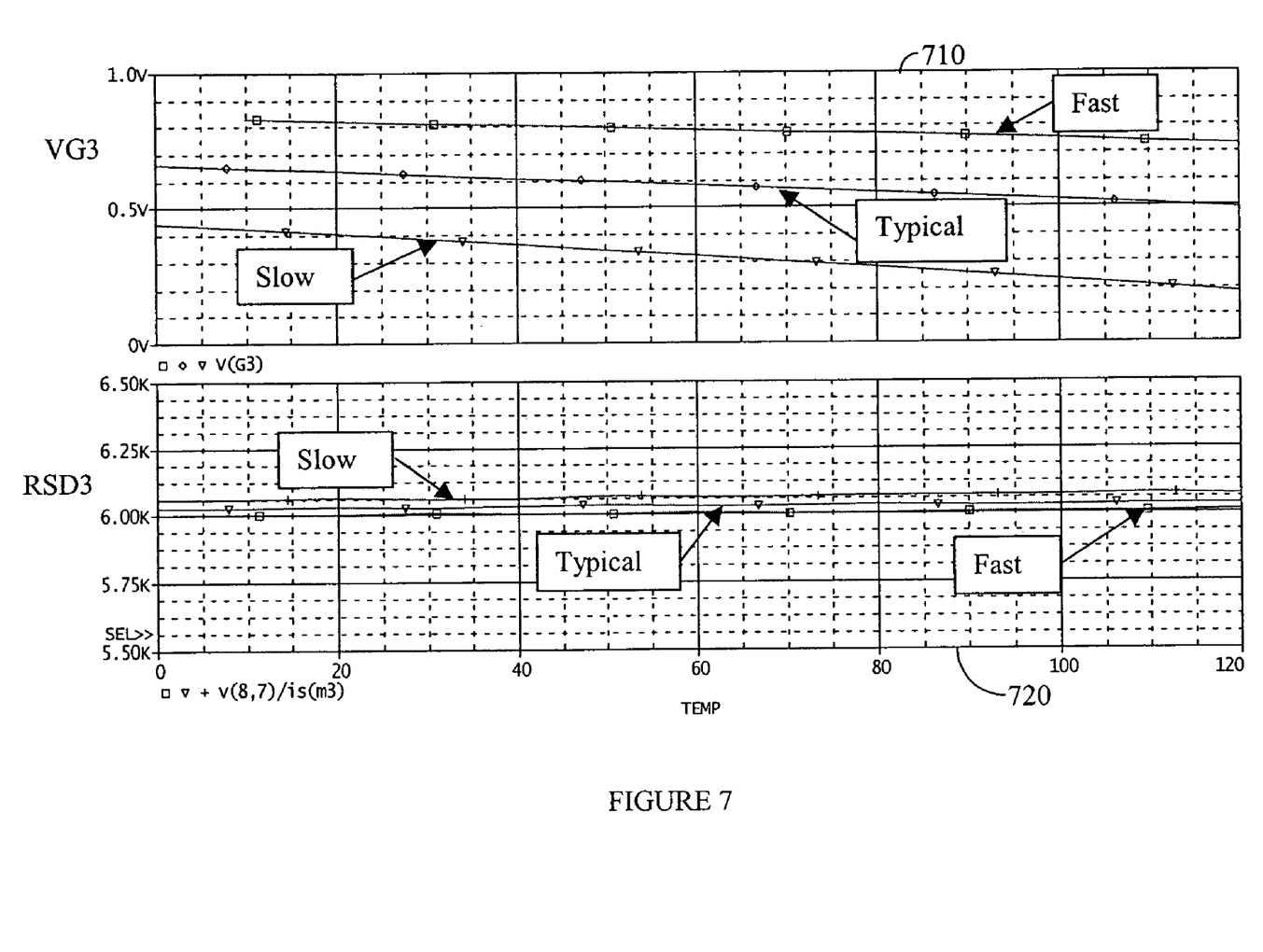
FIG. 7 is a result of the simulation of the resistance provided by the resistance tuning system based on a balanced-driven FET device.

FIG. 7 presents the results of the simulation of the resistance provided by the resistance tuning system based on the balanced-driven FET device. The results are shown versus a temperature range of 0 to 120 degrees Celsius. The "slow" and "fast" processes are simple versions of the "typical" process with $V_T$ and mobility changed by +/−0.1 V and −/+10%. Plot 710 shows considerable variation in the voltage that the system applies to the gate of FET 660. Plot 720 shows little variability around the 6 KOhm value of FET 660 $R_{SD}$. Therefore it is now shown that the channel resistance of FET 660 is maintained within a narrow range close to the intended value, for example 6 KOhm, thereby providing significant improvement over prior art solutions.

In the foregoing disclosure, the resistor setting the resistance of MOSFET 460 and thus the effective resistance of the MOSFETs in the differential circuit being controlled has been referred to as an external resistor. This represents a preferred embodiment, though is not a specific limitation of the invention, as the present invention may be realized using an on-chip resistor, with the desired accuracy being attained by any of various methods, such as, by way of example, by laser trimming, by the use of fuses to control a resistive value, or by programming of floating gate memory devices to control switches coupling resistor components in circuit as required. The frequency response of a circuit using MOSFET resistors could even be changed under program control by effectively changing one or more resistor values under program control. On the other hand, use of an external resistor provides for automatic tuning of MOSFET resistors in the presence of process and temperature variations through a single additional pin.

Also, it will be noted in FIGS. 5 and 6 that the circuits have $V_{REF}$ as inputs. The common mode input to the circuit 810 of FIG. 8 may be determined and used for that input, or $V_{REF}$ may be independently generated for use in the circuits of FIG. 5 or 6, and the common mode of the differential signal input to the circuit 810 of FIG. 8 shifted to that VREF.

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features as desired.

What is claimed is:

1. A circuit for providing automatic setting and linearization of the resistance of on-chip MOS resistors of a first conductivity type for processing a differential signal having a common mode reference voltage comprising an integrated circuit having:
    a FET of the first conductivity type having a source, a drain, a gate and a substrate; and,
    control circuitry coupled to the FET and adapted to be responsive to a control resistance to apply a voltage differential between the source and drain centered about a common mode reference voltage, and to control the gate to provide a current I through the FET, whereby a control resistance may set the resistance of the FET at the voltage differential divided by the current I through the FET;
    the substrate of the FET being coupled to the same voltage as the substrates of the on-chip MOS resistors, the gate of the FET being coupled to gates of the on-chip MOS resistors.

2. The circuit of claim 1 wherein the common mode reference voltage is a fixed common mode reference voltage and said on-chip MOS resistors are part of a differential circuit having a differential input centered around the fixed common mode reference voltage.

3. The circuit of claim 1 wherein the FET of the first conductivity type comprises a FET selected from the group consisting of PMOS FETs and NMOS FETs.

4. The circuit of claim 1 wherein the control circuitry predetermines the voltage differential between the source and drain of the FET, and controls the gate of the FET to provide a current I through the FET responsive to the control resistance.

5. The circuit of claim 1 wherein the control circuitry controls the gate of the FET to provide a predetermined current I through the FET, and controls the voltage differential between the source and drain of the FET responsive to the control resistance.

6. The circuit of claim 2 wherein said on-chip MOS resistors are part of a MOSFET-C filter.

7. The circuit of claim 1 further comprising a control resistance.

8. The circuit of claim 1 wherein the control resistance is an external resistance coupled between an input terminal to the circuit and the circuit power supply terminal.

9. The circuit of claim 8 wherein the power supply terminal is a circuit ground terminal.

10. The circuit of claim 7 wherein the control resistance is part of the integrated circuit.

11. The circuit of claim 7 wherein control circuitry is responsive to the control resistance to provide a combination of voltage differential between the source and drain of the FET and a current I though the FET to operate the FET in the triode region.

12. The circuit of claim 7 wherein the control resistance sets the resistance of the FET at a value proportional to the control resistance and ratios of on-chip currents and resistances, whereby the use of a temperature insensitive control resistance will provide a FET resistance that is insensitive to temperature and process variations.

13. The circuit of claim 1 wherein the circuit is implemented as an integrated circuit.

14. A resistance tuning circuit comprising:
    first, second, third, fourth and fifth MOS FETs, each having a source, a drain and a gate;
    the first MOSFET having its gate coupled to an output of a first operational amplifier, the source and drain of the first MOSFET being connected to first and second equal current sources, respectively;
    the second MOSFET having its gate coupled to an output of a second operational amplifier, an inverting input of the second operational amplifier being coupled to the source of the second MOSFET and to the first bias current source, and a non-inverting input of the second operational amplifier being coupled to a first reference voltage;
    the third MOSFET having its gate coupled to an output of a third operational amplifier, an inverting input of the third operational amplifier being coupled to the source of the third MOSFET and to the second bias current source, and the non-inverting node of the third operational amplifier being coupled to a second reference voltage; and,
    the fourth MOSFET and the fifth MOSFET being connected as a one-to-one current mirror, the drain of the fourth MOSFET coupled to the non-inverting node of the first operational amplifier, the drain of the second MOSFET and to a reference current source, the gate of the fourth MOSFET being coupled to the gate of the fifth MOSFET, the drain of the fifth MOSFET being coupled to the drain of the third MOSFET, the inverting node of the first operational amplifier, and the gate of the fifth MOSFET;
    the first reference voltage and the second reference voltage causing a balanced voltage across of the first MOSFET centered around a fixed common mode reference voltage.

15. A MOSFET-C filter comprising at least a plurality of MOSFET resistors the tuning of which is performed by the resistance tuning circuit of claim 14, wherein the gate of the first MOSFET is coupled to the gates of the plurality of MOSFET resistors, and the substrate of the first MOSFET is coupled to the substrate of each of the plurality of MOSFET resistors.

16. The MOSFET-C filter of claim 15, wherein the resistance tuning circuit is responsive to the value of a single resistor.

17. In an integrated circuit, a method of setting and linearizing the resistance of MOSFET resistors of a first conductivity type using a differential circuit having a common mode reference voltage, the method comprising:
    providing a MOSFET of the same conductivity type as the MOSFET resistors, the MOSFET and the MOSFET resistors each having a substrate, a source, a drain and a gate, the substrates being coupled to a common voltage and the gates of the MOSFET and the MOSFET resistors being coupled together;

controlling the gate of the MOSFET while providing a differential voltage between the source and the drain of the MOSFET centered at the fixed common mode reference voltage to obtain a desired ratio of the differential voltage divided by the current through the MOSFET.

18. The method of claim 17 further comprising:
predetermining the differential voltage; and,
controlling the gate of the MOSFET to adjust the current through the MOSFET;
wherein a desired ratio of the differential voltage divided by the current through the MOSFET is obtained.

19. The method of claim 18 further comprising:
setting the current trough the MOSFET by selecting an external resistor.

20. The method of claim 17 further comprises:
providing a MOSFET having the same channel width W and channel length L as the MOSFET resistors.

21. The method of claim 19 further comprises:
selecting the external resistor to provide a combination of differential voltage between the source and drain of the FET and a current through the FET to operate the FET in the triode region.

22. The method of claim 17 wherein the control resistance sets the resistance of the FET at a value proportional to the control resistance and ratios of on-chip currents and resistances, whereby the use of a temperature insensitive control resistance will provide a FET resistance that is insensitive to temperature and process variations.

23. A method for tuning the resistance of an on-chip metal oxide semiconductor (MOS) field effect transistor (FET) resistor, the method comprising:
providing a balanced voltage across a FET centered about a reference voltage;
applying a gate voltage to the FET to control the resistance of the FET;
determining the resistance of the FET by an external resistor.

24. A method for tuning the resistance of an on-chip metal oxide semiconductor (MOS) field effect transistor (FET) resistor, the method comprising:
providing a balanced voltage across a FET centered about a reference voltage by:
applying a first voltage to a first node of the FET, the first node being either the source or the drain of the FET; and,
applying a second voltage to a second node of the FET, the second node being the drain if the first node is the source or the source of the FET if the first node is the drain;
the average between the first voltage and the second voltage being equal to the reference voltage;
applying a gate voltage to the FET to control the resistance of the FET;
determining the resistance of the FET by an external resistor.

25. The method of claim 24 wherein the method further comprises:
providing a reference current for controlling a gate voltage of the FET.

26. The method of claim 25 wherein the reference current is equal to four times a voltage difference between the first voltage and the second voltage divided by a desired channel resistance of the FET.

27. The method of claim 26 wherein the method further comprises:
comparing the reference current to four times the voltage difference divided by the actual channel resistance of the FET; and,
causing the gate voltage to change in a direction that decreases the channel resistance if the reference current is larger than four times the voltage difference divided by the actual channel resistance of the FET.

28. The method of claim 26 wherein the method further comprises:
comparing the reference current to four times the voltage difference divided by the actual channel resistance of the FET; and,
causing the gate voltage to change in a direction that increases the channel resistance if reference current is smaller than four time the voltage difference divided by the actual channel resistance of the FET.

29. A method for tuning the resistance of an on-chip metal oxide semiconductor (MOS) field effect transistor (FET) resistor, the method comprising:
providing a balanced voltage across a FET centered about a reference voltage;
applying a gate voltage to the FET to control the resistance of the FET;
determining the resistance of the FET by an external resistor by multiplying the external resistor value by a constant value.

30. The method of claim 29 wherein determination of the constant value comprises at least one of:
determining a ratio between two on-chip resistors; and,
determining a ratio between two on-chip current sources.

31. The method of claim 29 wherein the constant value is essentially indifferent to at least one of: temperature changes, manufacturing process variability, aging, humidity, and package stress.

32. A circuit for providing one-pin automatic tuning and linearizing of at least an on-chip metal oxide semiconductor (MOS) field effect transistor (FET) resistor, the circuit comprising of at least:
a FET;
control circuitry to enable the control of the FET resistance by applying a first voltage to the gate of the FET and further to enable an equally centered voltage around a fixed common mode reference voltage across the two other nodes of the FET to operate the FET in the triode region, the first node of the FET being connected to a second voltage and the second node of the FET being coupled to a third voltage, the average of the second voltage and the third voltage being equal to the fixed common mode reference voltage; and,
an external resistor connected by one-pin to the control circuitry causing the resistance of the FET to be a function of the external resistor multiplied by a constant value;
the substrate of the FET being adapted to be coupled to the same voltage as the substrates of on-chip MOS resistors.

33. The circuit of claim 32 wherein the circuit is further connected to a reference current, wherein the reference current is equal to four times the difference voltage between the second voltage and the third voltage divided by a desired channel resistance of the FET.

34. The circuit of claim 33 wherein upon the reference current being larger than four times the difference voltage divided by the channel resistance of the FET, the control circuitry causes the first voltage to change in a direction that decreases the channel resistance.

35. The circuit of claim 33 wherein upon the reference current being smaller than four times the difference voltage value divided by the channel resistance of the FET, the control circuitry causes the first voltage to change in a direction that increases the channel resistance.

36. The circuit of claim 32 wherein the constant value is at least one of: a ratio between two on-chip resistors, a ratio between two on-chip current sources.

37. The circuit of claim 36 wherein the constant value is indifferent to at least one of: temperature changes, manufacturing process variability, aging, humidity and package stress.

38. A method for tuning the resistance of an on-chip metal oxide semiconductor (MOS) field effect transistor (FET) resistor, the method comprising:
providing an equally centered voltage around a fixed common mode reference voltage across a FET;
applying a gate voltage to the FET to control the resistance of the FET;
determining the resistance of the FET by an external resistor.

39. A method for tuning the resistance of an on-chip metal oxide semiconductor (MOS) field effect transistor (FET) resistor, the method comprising:
providing an equally centered voltage around a fixed common mode reference voltage across a FET by:
applying a first node of the FET with a first voltage, the first node being either the source or the drain of the FET; and,
applying a second node of the FET with a second voltage, the second node being the drain if the first node is the source or the source of the FET if the first node is the drain;
the average of the first voltage and the second voltage being equal to the fixed common mode reference voltage;
applying a gate voltage to the FET to control the resistance of the FET; and,
determining the resistance of the FET by an external resistor.

40. A method for tuning the resistance of an on-chip metal oxide semiconductor (MOS) field effect transistor (FET) resistor, the method comprising:
providing an equally centered voltage around a fixed common mode reference voltage across a FET;
applying a gate voltage to the FET to control the resistance of the FET by providing a reference current for the purpose of controlling the gate voltage;
determining the resistance of the FET by an external resistor.

41. The method of claim 40 wherein the reference current is equal to four times the voltage difference between the first voltage and the second voltage divided by a desired channel resistance of the FET.

42. The method of claim 41 wherein the method further comprises:
comparing the reference current to four times the voltage difference divided by the channel resistance of the FET; and,
causing the gate voltage to change in a direction that decreases the channel resistance if the reference current is larger than four times the voltage difference divided by the channel resistance of the FET.

43. The method of claim 41 wherein the method further comprises:
comparing the reference current to four times the voltage difference divided by the channel resistance of the FET; and,
causing the gate voltage to change in a direction that increases the channel resistance if reference current is smaller than four times the delta voltage value divided by the channel resistance of the FET.

44. A method for tuning the resistance of an on-chip metal oxide semiconductor (MOS) field effect transistor (FET) resistor, the method comprising;
providing an equally centered voltage around a fixed common mode reference voltage across a FET;
applying a gate voltage to the FET to control the resistance of the FET;
determining the resistance of the FET by an external resistor;
wherein determining the resistance of the FET comprises:
multiplying the external resistor value by a constant value.

45. The method of claim 44 wherein determination of the constant value comprises at least one of:
determining a ratio between two on-chip resistors; and,
determining a ratio between two on-chip current sources.

46. The method of claim 44 wherein the constant value is essentially indifferent to at least one of: temperature changes, manufacturing process variability, aging, humidity, package stress.

47. A filter comprising at least a tuned on-chip metal oxide semiconductor (MOS) field effect transistor (FET) resistor, the tuned FET resistor comprising:
a FET;
control circuitry to enable the tuning of the FET resistance by applying a first voltage to the gate of the FET and further to enable an equally centered voltage around a fixed common mode reference voltage across of the FET top operate the FET in the triode region; and,
an external resistor connected by one-pin to the control circuitry causing the resistance of the FET to be a constant function of the external resistor;
the substrate of the FET being adapted to be coupled to the same voltage as the substrates of the on-chip MOS resistors of the filter.

48. The filter of claim 47 wherein the first voltage is further supplied to a plurality of the on-chip MOS resistors of the filter.

49. The filter of claim 48 wherein the filter's FETs are further of the same channel type as the FET.

50. The filter of claim 48 wherein the filter's FETs have at least the same of one of: width of the FET, length of the FET.

51. The filter of claim 48 wherein the plurality of the filter's FET are further driven in a differential fashion.

52. The filter of claim 51 wherein each of the plurality of the filter's FETS is further driven with the voltage across the FET being centered around a fixed common mode reference voltage.

53. The filter of claim 47 wherein the circuit is further connected to a reference current, wherein the reference current is equal to four times the voltage difference across of the FET divided by the desired channel resistance of the FET.

54. The filter of claim 53 wherein upon the reference current being larger than four times the voltage difference divided by the channel resistance of the FET, the control circuitry causes the first voltage to change in a direction that decreases the channel resistance of the FET.

55. The filter of claim 53 wherein upon the reference current being smaller than four times the voltage difference divided by the channel resistance of the FET, the control circuitry causes the first voltage to change in a direction that increases the channel resistance of the FET.

56. The filter of claim 47 wherein the constant value is at least one of: a ratio between two on-chip resistors, a ratio between two on-chip current sources.

57. The filter of claim 56 wherein the constant value is essentially indifferent to at least one of: temperature changes, manufacturing process variability, aging, humidity, package stress.

58. The filter of claim 47 wherein the filter is a MOSFET-C filter.

59. A circuit providing automatic setting and linearization of the resistance of on-chip FET resistors of a first conductivity type for processing a differential signal having a common mode voltage comprising an integrated circuit having:

a FET of the first conductivity type having a source, a drain, a gate and a substrate; and, control circuitry coupled to the FET for responding to a control to apply a voltage differential between the source and drain centered about the common mode reference voltage to operate the FET in the triode region, and to control the gate to provide a current I through the FET, whereby the control resistance sets the resistance of the FET at the voltage differential divided by the current I through the FET;

the substrate of the FET being coupled to the same voltage as substrates of the on-chip MOS resistors;

the gate of the FET being coupled to all gates of the on-chip resistors.

* * * * *